United States Patent
Zhou et al.

(10) Patent No.: US 9,136,374 B2
(45) Date of Patent: Sep. 15, 2015

(54) METHOD OF FABRICATING P-TYPE SURFACE-CHANNEL LDMOS DEVICE WITH IMPROVED IN-PLANE UNIFORMITY

(71) Applicant: SHANGHAI HUA HONG NEC ELECTRONICS CO., LTD., Shanghai (CN)

(72) Inventors: Zhengliang Zhou, Shanghai (CN); Han Yu, Shanghai (CN); Biao Ma, Shanghai (CN)

(73) Assignee: SHANGHAI HUA HONG NEC ELECTRONICS CO., LTD., Shanghai (CN)

( * ) Notice: Subject to any disclaimer, the term of this patent is extended or adjusted under 35 U.S.C. 154(b) by 218 days.

(21) Appl. No.: 13/968,515

(22) Filed: Aug. 16, 2013

(65) Prior Publication Data

US 2014/0057405 A1 Feb. 27, 2014

(30) Foreign Application Priority Data

Aug. 24, 2012 (CN) .......................... 2012 1 0305990

(51) Int. Cl.
*H01L 21/336* (2006.01)
*H01L 29/78* (2006.01)
*H01L 29/10* (2006.01)
*H01L 29/66* (2006.01)

(52) U.S. Cl.
CPC ......... *H01L 29/7816* (2013.01); *H01L 29/1045* (2013.01); *H01L 29/1083* (2013.01); *H01L 29/66659* (2013.01); *H01L 29/78* (2013.01)

(58) Field of Classification Search
CPC ............ H01L 29/1045; H01L 29/1083; H01L 29/66659; H01L 29/78; H01L 29/7816
See application file for complete search history.

(56) References Cited

U.S. PATENT DOCUMENTS

| 5,124,271 A * | 6/1992 | Havemann ..................... 438/703 |
| 6,001,701 A * | 12/1999 | Carroll et al. .................. 438/364 |
| 6,746,928 B1 * | 6/2004 | Schuegraf et al. ............. 438/314 |
| 6,992,338 B1 * | 1/2006 | Yin et al. ....................... 257/197 |
| 2014/0131796 A1 * | 5/2014 | Zhou et al. .................... 257/336 |

* cited by examiner

*Primary Examiner* — Zandra Smith
*Assistant Examiner* — John M Parker
(74) *Attorney, Agent, or Firm* — MKG LLC

(57) ABSTRACT

A method of fabricating a P-type surface-channel laterally diffused metal oxide semiconductor device includes forming a gate structure with polysilicon and metal silicide, and the processes of channel implantation, long-time high-temperature drive-in, formation of a heavily doped N-type polysilicon sinker and boron doping of a polysilicon gate, are performed in this order, thereby ensuring the gate not to be doped with boron during its formation. The high-temperature drive-in process is allowed to be carried out to form a channel with a desired width, and a short channel effect which may cause penetration or electric leakage of the resulting device is prevented. As the polysilicon gate is not processed by any high-temperature drive-in process after it is doped with boron, the penetration of boron through a gate oxide layer and the diffusion of N-type impurity contained in the heavily doped polysilicon sinker into the channel or other regions are prevented.

15 Claims, 9 Drawing Sheets

METHOD OF FABRICATING P-TYPE SURFACE-CHANNEL LDMOS DEVICE WITH IMPROVED IN-PLANE UNIFORMITY

CROSS-REFERENCES TO RELATED APPLICATIONS

This application claims the priority of Chinese patent application number 201210305990.0, filed on Aug. 24, 2012, the entire contents of which are incorporated herein by reference.

TECHNICAL FIELD

The present invention relates generally to the fabrication of semiconductor integrated circuits, and in particular, to a method of fabricating a P-type surface-channel laterally diffused metal oxide semiconductor (LDMOS) device with improved in-plane uniformity.

BACKGROUND

In addition to the necessary properties, including a relatively small size and a low electric leakage level, components for hand-held, battery-powered electronic devices are also required to have a property of rapid switching speed. A P-type LDMOS device generally includes an array of multiple gates, which enables an output current of greater than 10 A, and is hence widely used in power management circuits of hand-held electronic products. As a large gate array leads to a great total gate width, how to achieve a high uniformity to ensure a low electric leakage level is a crucial issue for P-type LDMOS devices. On the other hand, there is a contradiction that, although a high switching speed requires a low threshold voltage, the latter typically causes a relatively high leakage current. Compared with buried-channel devices, surface-channel devices can be compromised between a low threshold voltage and a low electric leakage level. FIG. 1 shows a conventional P-type LDMOS device, which includes an N-type substrate 1', an N-type epitaxial region 2', an N-type channel 5', a first lightly doped drain drift diffusion region 6', a second lightly doped drain drift diffusion region 7', a heavily doped N-type polysilicon sinker 3', a gate oxide layer 9', a polysilicon gate 4', a tungsten/silicon bi-layer 8', a drain 10', a source 11', and polysilicon sidewall spacers 13'. Conventional methods for making the device include the skeleton steps of: growing an N-type epitaxial layer 2' over the heavily doped N-type substrate 1'; etching the N-type epitaxial layer 2' to form a deep trench therein, filling heavily doped N-type polysilicon in the deep trench and etching the polysilicon back to the same level with a top surface of the epitaxial layer 2', thereby forming the heavily doped N-type polysilicon sinker 3'; performing a first P-type ion implantation to form the first lightly doped drain drift diffusion region 6'; growing the gate oxide layer 9', depositing thereon P-type doped polysilicon and a tungsten/silicon bi-layer, and performing photolithography and dry etching processes thereon to form a gate structure comprised of the polysilicon gate 4' and the tungsten/silicon bi-layer 8'; performing an N-type channel ion implantation process and a rapid thermal annealing process to form the N-type channel 5'; performing a second P-type ion implantation to form the second lightly doped drain drift diffusion region 7'; depositing a dielectric layer and etching it to form the polysilicon sidewall spacers 13'; forming the source and drain by photolithography and ion implantation processes, followed by a rapid thermal annealing process for activating the whole structure; and completing the device after forming metal silicide pads 12', contact holes and metal connections (not shown).

In such methods, in order to prevent the P-type impurity (which is typically boron) contained in the polysilicon gate 4' from penetrating through the gate oxide layer 9' and entering the tungsten/silicon bi-layer 8', a rapid thermal annealing process is adopted to form the N-type channel 5'. This may easily lead to a relatively short channel with a greatly inter-process variation in its length. Although it is applicable to substitute the rapid thermal annealing process for a long-time high-temperature drive-in process to avoid the short channel effect, the latter may cause impurity in the heavily doped polysilicon deposited in the deep trench to diffuse into the channel 5' and boron in the gate structure to easily penetrate through the gate oxide layer 9' and enter the channel 5'. Moreover, as the tungsten/silicon bi-layer has a higher dissolving capability to solid boron than polysilicon, forming the gate structure with the polysilicon gate 4' and the tungsten/silicon bi-layer 8' may lead to the diffusion of boron into the tungsten/silicon bi-layer 8', thus decreasing the boron content of the polysilicon gate 4' and increasing the proneness of the device to be depleted. All the above problems may increase the non-uniformity of threshold voltage and other properties of the device.

SUMMARY OF THE INVENTION

The present invention is directed to the provision of a method of fabricating a P-type surface-channel LDMOS device with improved in-plane uniformity, which is capable of preventing depletion, penetration and electric leakage of the device and hence improving its uniformity and stability.

To achieve the above objectives, there is provided a method of fabricating a P-type surface-channel LDMOS device with improved in-plane uniformity, which includes the following steps in the sequence set forth:

step a) sequentially growing an N-type epitaxial region and a gate oxide layer over an N-type substrate and depositing a non-doped polysilicon layer over the gate oxide layer;

step b) etching the non-doped polysilicon layer to form a polysilicon gate and performing an N-type ion implantation with a portion of the polysilicon gate and a portion of the gate oxide layer, both on a first side of the polysilicon gate, covered with a photoresist, wherein an energy of the N-type ion implantation is controlled to make the implanted ions not penetrate through the polysilicon gate;

step c) removing the photoresist and performing a first P-type ion implantation, followed by a high-temperature drive-in process, thereby forming a first lightly doped drain drift diffusion region in a portion of the N-type epitaxial region on the first side of the polysilicon gate and an N-type channel in a portion of the N-type epitaxial region on a second side of the polysilicon gate, wherein both of the N-type channel and the first lightly doped drain drift diffusion region laterally extend a certain distance under the polysilicon gate;

step d) performing a second P-type ion implantation on the first side of the polysilicon gate, thereby forming a second lightly doped drain drift diffusion region in the first lightly doped drain drift diffusion region;

step e) depositing a silicon oxide layer, removing a portion of the silicon oxide layer covering a portion of the N-type channel at a farther end from the polysilicon gate to expose a corresponding portion of the underlying N-type epitaxial region, and etching the exposed portion of the N-type epitaxial region to form a deep trench, wherein the deep trench has its bottom in the N-type substrate;

step f) depositing a heavily doped N-type polysilicon in the deep trench and on the silicon oxide layer, such that the deep trench is fully filled with the heavily doped N-type polysilicon, thereby forming a polysilicon sinker;

step g) etching back the heavily doped N-type polysilicon until reaching the silicon oxide layer;

step h) depositing an organic dielectric layer and performing an etch back process on the organic dielectric layer and the silicon oxide layer to remove a portion of the organic dielectric layer and the underlying portion of the silicon oxide layer above a top face of the polysilicon gate, such that portions of the silicon oxide layer remained on the first and second sides of the polysilicon gate serve as silicon oxide sidewall spacers and a certain thickness of the organic dielectric layer is remained on an area other than top faces of the polysilicon gate and the silicon oxide sidewall spacers;

step i) performing a third P-type ion implantation on the polysilicon gate with an energy controlled to make the implanted ions not penetrate through the remaining portions of the organic dielectric layer and the silicon oxide layer;

step j) removing the organic dielectric layer and a portion of the silicon oxide layer to expose a portion of each of the N-type channel and the second lightly doped drain drift diffusion region and performing a source/drain ion implantation and a rapid thermal annealing process, thereby forming a source in the N-type channel and a drain in the second lightly doped drain drift diffusion region; and step k) forming a metal silicide layer on a top face of each of the polysilicon gate, the source and the drain.

In one specific embodiment, in the step a), the N-type substrate may be heavily doped and has a doping concentration of greater than $10^{20}$ cm$^{-3}$, and the N-type epitaxial region is light doped and has a doping concentration of $10^{14}$ cm$^{-3}$ to $10^{16}$ cm$^{-3}$. Moreover, the gate oxide layer may have a thickness of 120 to 300 Å, and the non-doped polysilicon layer has a thickness of 1500 Å to 4000 Å.

In one specific embodiment, in the step b), the N-type ion implantation is a self-aligned channel implantation with phosphorus ions implanted at an energy of lower than 80 keV and a dose of $10^{12}$ cm$^{-2}$ to $10^{14}$ cm$^{-2}$.

In one specific embodiment, in the step c), boron ions may be implanted in the first P-type ion implantation at an energy of 30 keV to 120 keV and a dose of $10^{11}$ cm$^{-2}$ to $10^{13}$ cm$^{-2}$, and the high-temperature drive-in process is performed at a temperature of 900° C. to 1050° C. for 30 minutes to 180 minutes.

In one specific embodiment, in the step d), boron ions may be implanted in the second P-type ion implantation at an energy of 30 keV to 120 keV and a dose of $10^{11}$ cm$^{-2}$ to $10^{13}$ cm$^{-2}$.

In one specific embodiment, in the step e), the silicon oxide layer may have a thickness of 1500 Å to 3000 Å.

In one specific embodiment, in the step f), the heavily doped N-type polysilicon may be doped with phosphorus or arsenic ions and have a doping concentration of greater than $10^{20}$ cm$^{-3}$, and a ratio of a thickness of the heavily doped N-type polysilicon deposited above the silicon oxide layer to a width of the deep trench may be greater than 1.2.

In one specific embodiment, after the etch back process in the step g), a top face of the remaining portion of the N-type heavily doped polysilicon that makes up the polysilicon sinker is 0 Å to 300 Å higher than a top face of the N-type epitaxial region.

In one specific embodiment, in the step h), the organic dielectric layer may have a thickness of 1000 Å to 5000 Å.

In one specific embodiment, in the step i), boron ions may be implanted in the third P-type ion implantation at an energy of 2 keV to 15 keV and a dose of greater than $10^{15}$ cm$^{-2}$.

In one specific embodiment, in the step j), boron ions may be implanted in the source/drain ion implantation at an energy of 5 keV to 80 keV and a dose of greater than $10^{15}$ cm$^{-2}$, and the rapid thermal annealing can be performed at a temperature of 1000° C. to 1100° C. for 5 seconds to 30 seconds.

Compared with the prior art methods, the method of the present invention uses the polysilicon and metal silicide to form the gate structure and adjusts the sequential order of the channel implantation, long-time high-temperature drive-in, heavily doped N-type polysilicon sinker formation and polysilicon gate boron doping processes to make the gate not be doped with boron during its formation. This allows the high-temperature drive-in process to be carried out for a sufficiently long time to form a channel with a desired length and prevents a short channel effect which may cause penetration or electric leakage of the resulting device. Moreover, carrying out the silicon oxide deposition, polysilicon sinker formation, gate sidewall spacers formation and polysilicon gate doping processes after the lightly doped drain drift region is formed enables the implantation of boron not to be followed by any high-temperature drive-in process, thereby preventing boron from penetrating through the gate oxide layer, and also preventing the N-type impurity in the polysilicon sinker from diffusing out into the channel or other regions. All of these advantages ensure stable operation for the resulting device and simplicity for the method.

DETAILED DESCRIPTION

To further describe the present invention, reference is made to the following detailed description on example embodiments, taken in conjunction with the accompanying drawings.

The present invention provides a method of fabricating a P-type surface-channel LDMOS device with improved in-plane uniformity, which includes the steps described in detail below.

Figure 1:
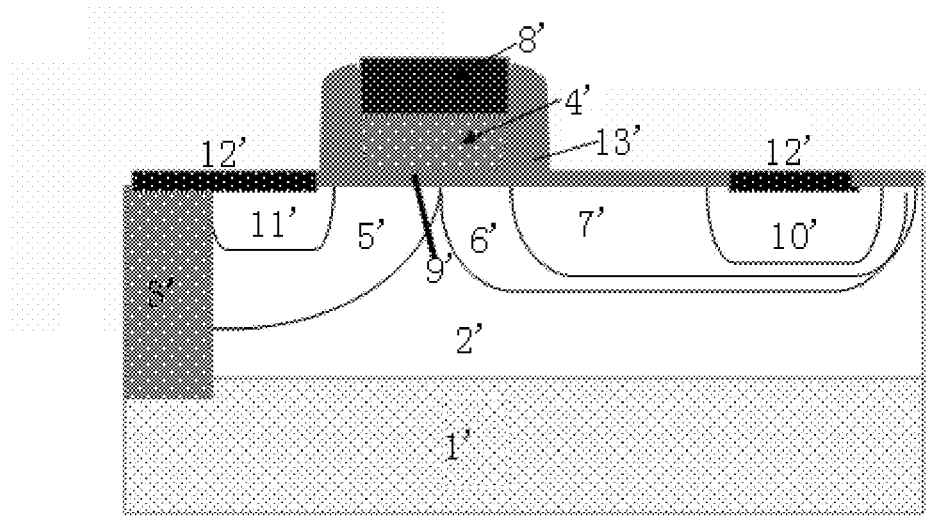
FIG. 1 shows a schematic illustration of a cross sectional view of a conventional P-type surface-channel LDMOS device.
Figure 2:
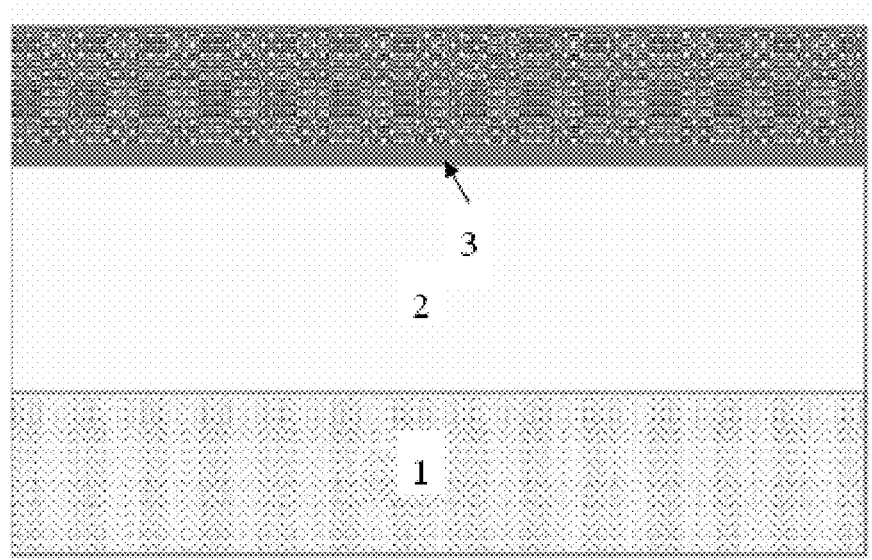
FIGS. 2 to 15 show schematic illustrations of cross sectional views of structures formed after steps of a method of fabricating a P-type surface-channel LDMOS device in accordance with the present invention.

In a first step of the method, a lightly doped N-type epitaxial region 2 is grown on a heavily doped N-type substrate 1. Next, as shown in FIG. 2, a gate oxide layer 3 with a thickness of, for example, 120 Å to 300 Å, is grown over the N-type epitaxial region 2, and thereafter a non-doped polysilicon layer is deposited over the gate oxide layer 3. The N-type substrate 1 may have a doping concentration of greater than $10^{20}$ cm$^{-3}$, and the N-type epitaxial region 2 has a doping concentration of $10^{14}$ cm$^{-3}$ to $10^{16}$ cm$^{-3}$. Every increase of 1 μm in the thickness of the N-type epitaxial region 2 may lead to an increase of 10 V to 12 V in the breakdown voltage of the device being fabricated. The non-doped polysilicon layer may have a thickness of 1500 Å to 4000 Å.

Figure 3:
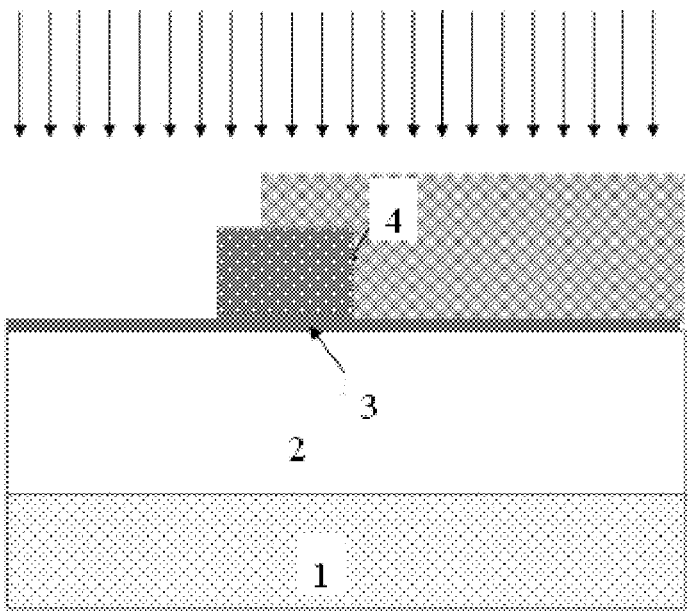

In a second step of the method, a polysilicon gate 4 is formed by performing a photolithography and dry etching process on the non-doped polysilicon layer. Next, as shown in FIG. 3, a self-aligned N-type channel implantation is performed on the gate 4, selectively with phosphorus ions implanted at an energy of lower than 80 keV and a dose of $10^{12}$ cm$^{-2}$ to $10^{14}$ cm$^{-2}$, with an area where a drain is to be formed in a subsequent process and a portion of the polysilicon gate that is proximate to the area protected by photoresist and the rest portion of the polysilicon gate and an area where a source is to be formed in a subsequent process exposed. In the channel implantation, the implantation energy is controlled to make the implanted ions not penetrate through the polysilicon gate 4.

Figure 4:
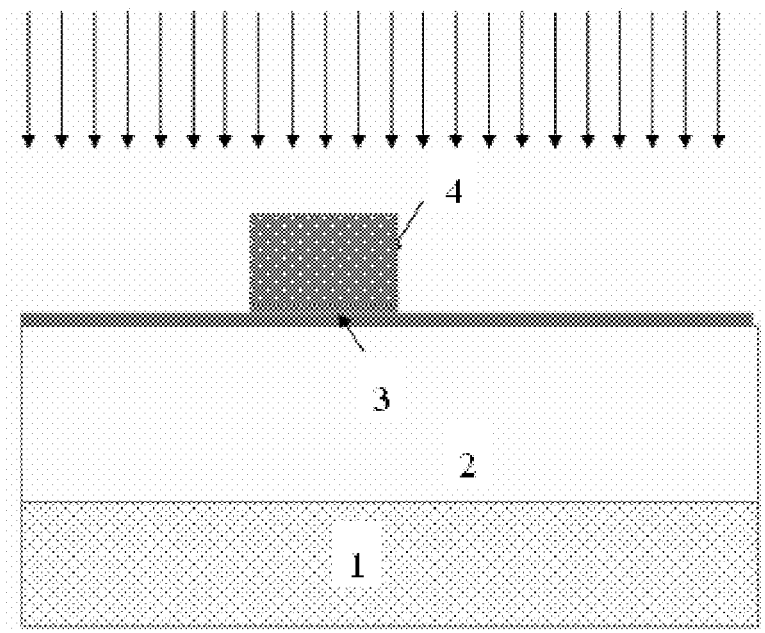

As shown in FIG. 4, in a third step, the photoresist is removed and a first P-type ion implantation is performed, selectively with boron ions implanted at an energy of 30 keV to 120 keV and a dose of 10 cm$^{-2}$ to $10^{13}$ cm$^{-2}$.

Figure 5:
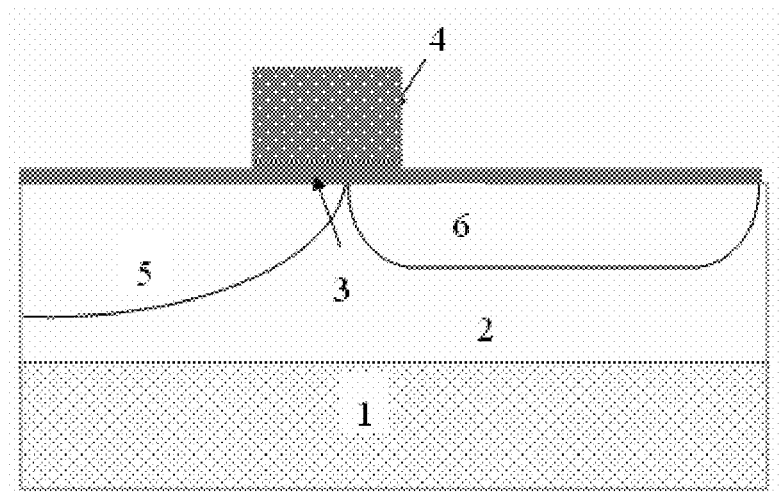

Referring to FIG. 5, in a fourth step, a high-temperature drive-in process is performed to form an N-type channel 5 and a first lightly doped drain drift diffusion region 6. The high-temperature drive-in process may be performed at a temperature of 900° C. to 1050° C. for 30 minutes to 180 minutes. As a length of the channel being formed is determined by the penetration depth of the high-temperature drive-in process, it is possible to adjust the temperature and time of the drive-in process to form a channel with a desired length. Moreover, a depth of the first lightly doped drain drift diffusion region 6 is also determined by the conditions of the high-temperature drive-in process.

Figure 6:
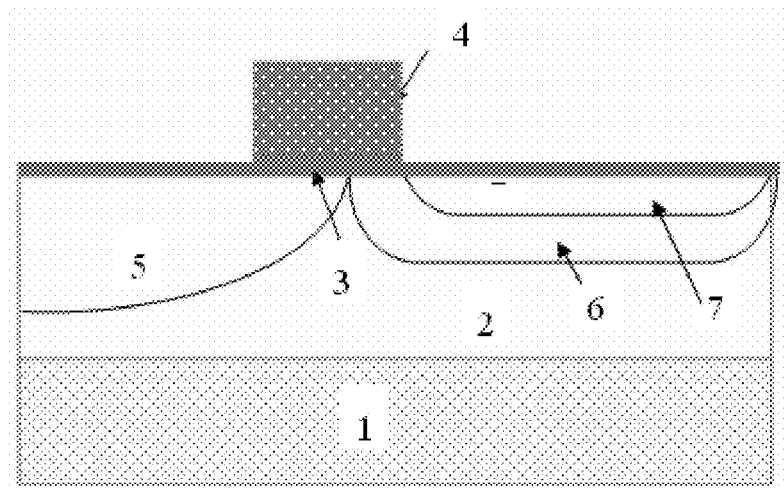

In a fifth step, a second P-type ion implantation is performed, selectively with boron ions implanted at an energy of 30 keV to 120 keV and a dose of $10^{11}$ cm$^{-2}$ to $10^{13}$ cm$^{-2}$, thereby forming a second lightly doped drain drift diffusion region 7, as shown in FIG. 6.

Figure 7:
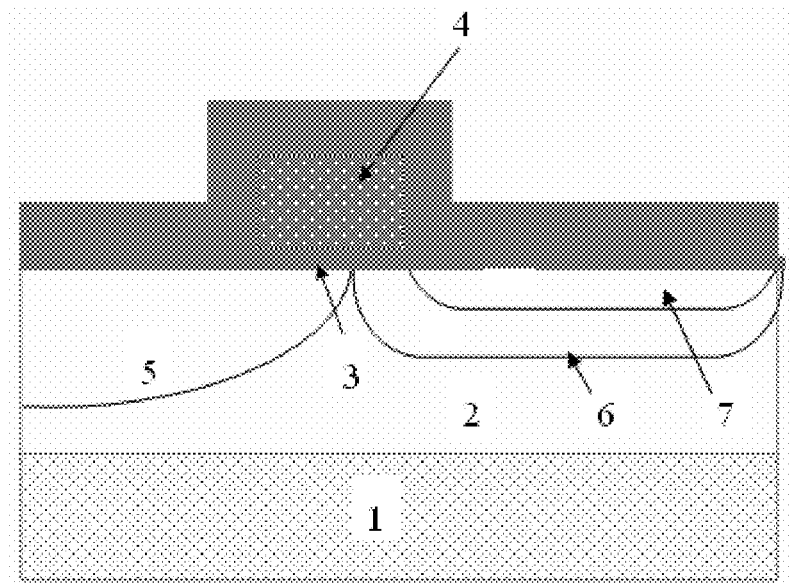

With continuing reference to FIG. 7, in a sixth step, a silicon oxide layer selectively with a thickness of 1500 Å to 3000 Å is deposited.

Figure 8:
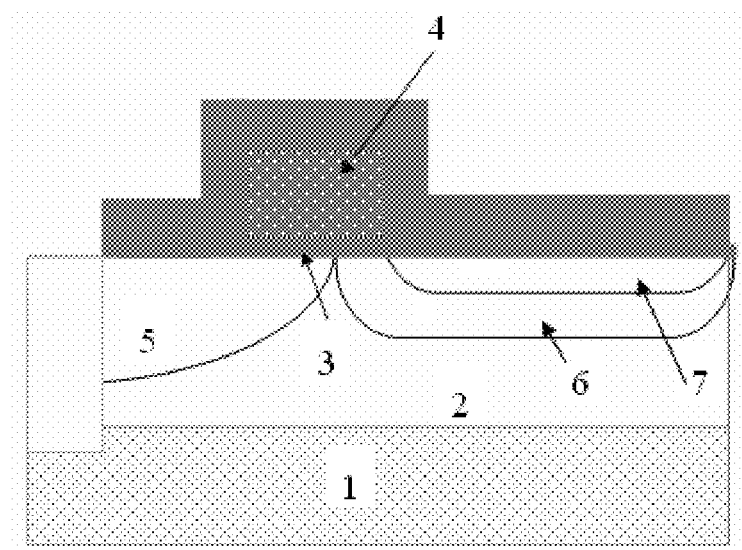

In a seventh step, a portion of the silicon oxide layer covering a portion of the N-type channel 5 at a farther end from the polysilicon gate 4 is removed by photolithography and dry etching. Next, the corresponding exposed portion of the underlying N-type epitaxial region 2 is etched to form a deep trench with its bottom in the N-type substrate 1, as shown in FIG. 8.

Figure 9:
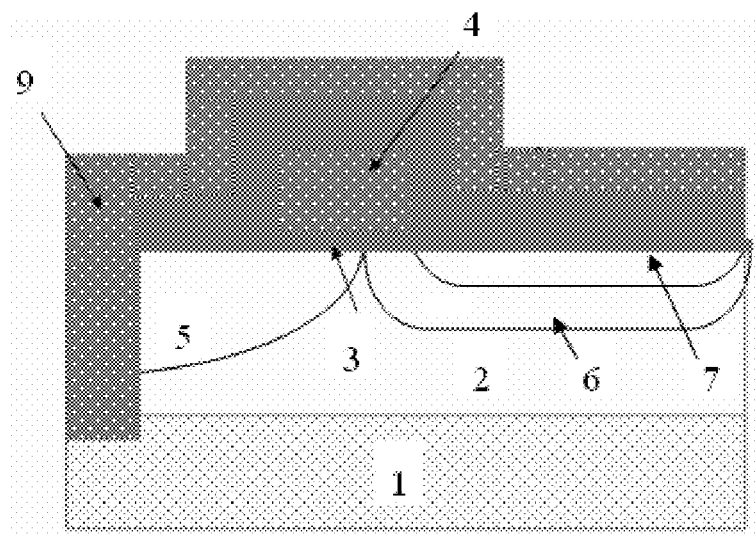

Referring to FIG. 9, in an eighth step, a heavily doped N-type polysilicon is deposited in the deep trench and on the silicon oxide layer, such that the deep trench is fully filled with the heavily doped N-type polysilicon, thereby forming a polysilicon sinker 9. The heavily doped N-type polysilicon may be doped with phosphorus or arsenic ions and has a doping concentration of greater than $10^{20}$ cm$^{-3}$. The ratio of a thickness of heavily doped N-type polysilicon deposited above the silicon oxide layer to a width of the deep trench may be greater than 1.2.

Figure 10:
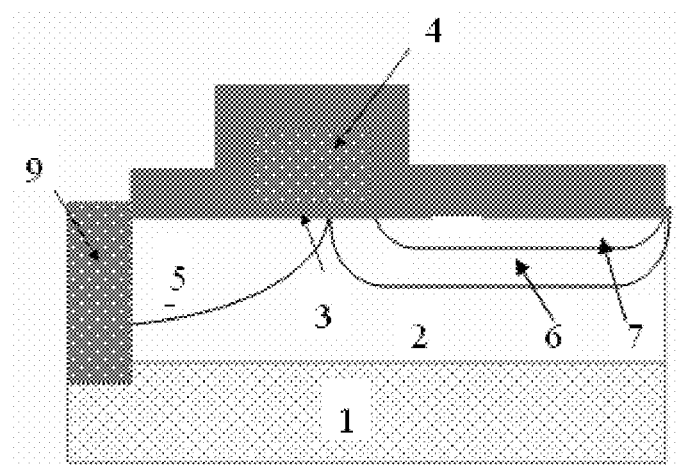

With reference to FIG. 10, in a ninth step, the heavily doped N-type polysilicon is etched back until a top surface of the silicon oxide layer is reached. After that, a top face of the etched polysilicon sinker 9 may be 0 Å to 300 Å higher than a top face of the N-type epitaxial region 2.

Figure 11:
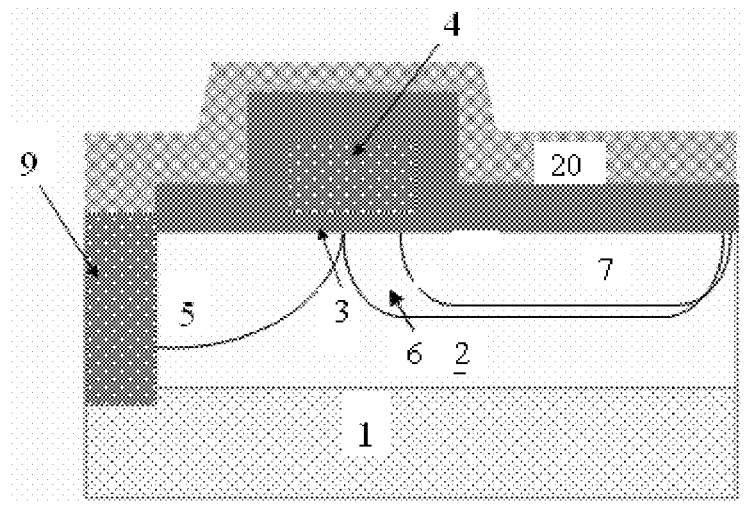

In a tenth step, an organic dielectric layer 20 selectively with a thickness of 1000 Å to 5000 Å is deposited, as shown in FIG. 11.

Figure 12:
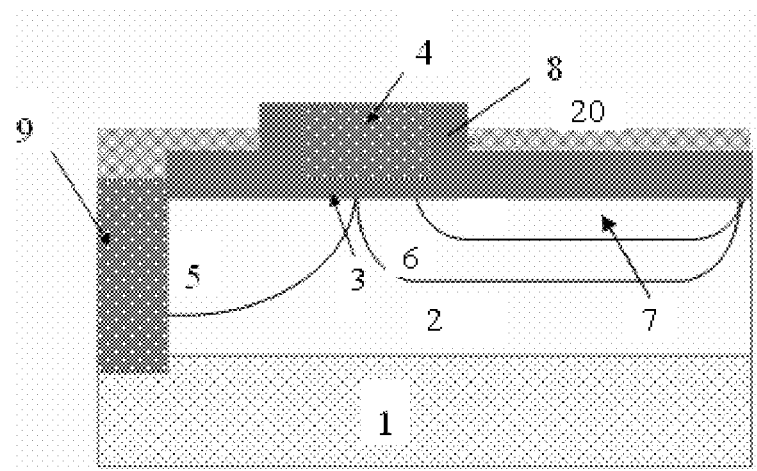

Referring to FIG. 12, in an eleventh step, an etch back process is performed on the organic dielectric layer 20 and the silicon oxide layer, such that a portion of the organic dielectric layer 20 and the underlying portion of the silicon oxide layer above a top face of the polysilicon gate 4 are removed; portions of the silicon oxide layer that covers side faces of the polysilicon gate 4 are remained and serve as silicon oxide sidewall spacers 8; a certain thickness of the organic dielectric layer 20 is remained on an area other than the top faces of the polysilicon gate 4 and the silicon oxide sidewall spacers 8.

Figure 13:
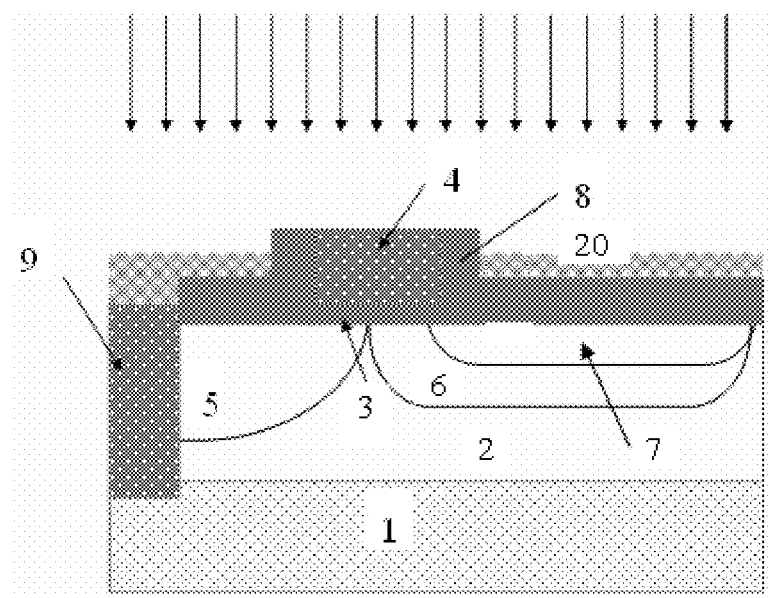
Figure 14:
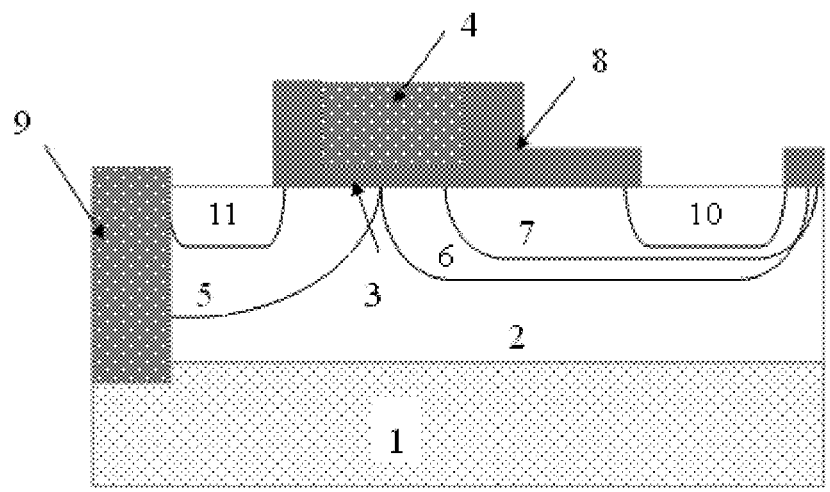

With reference to FIG. 13, in a twelfth step, a P-type ion implantation is performed to the polysilicon gate 4, selectively with boron ions implanted at an energy of 2 keV to 15 keV and a dose of greater than $10^{15}$ cm$^{-2}$. The implantation energy may ensure that the remaining portions of the organic dielectric layer and the silicon oxide layer are not penetrated through.

In a thirteenth step, the organic dielectric layer 20 is removed and areas for forming a source and a drain are defined by photolithography. Next, a wet etching process is performed to remove portions of the silicon oxide layer where the source and the drain are to be formed, followed by source/drain ion implantation and rapid thermal annealing, thereby forming a heavily doped P-type source 11 and a heavily doped P-type drain 10 in the respective exposed areas. In the source/drain ion implantation, boron ions may be implanted at an energy of 5 keV to 80 keV and a dose of greater than $10^{15}$ cm$^{-2}$, and the rapid thermal annealing may be performed at a temperature of 1000° C. to 1100° C. for 5 seconds to 30 seconds.

Figure 15:
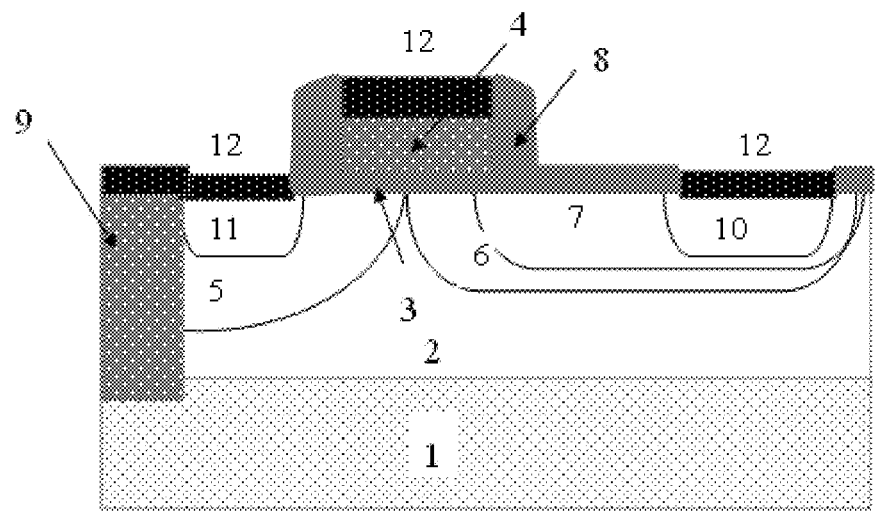

Referring to FIG. 15, in a fourteenth step, an area is opened above each of the source and the drain, and metal-silicification processes are carried out to form a metal silicide pad 21 on top of each of the polysilicon gate 4, the source 11 and the drain 10.

Figure 16:
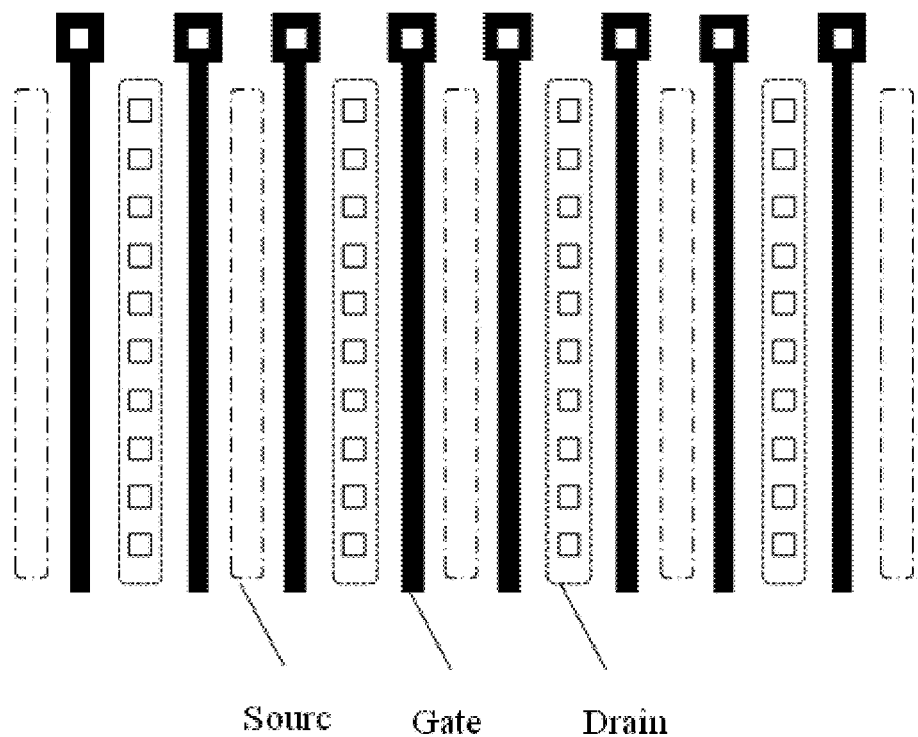
FIG. 16 depicts a top view of a multi-finger device constituted by a P-type LDMOS device including a plurality of gates interconnected in parallel in accordance with the present invention.
Figure 17:
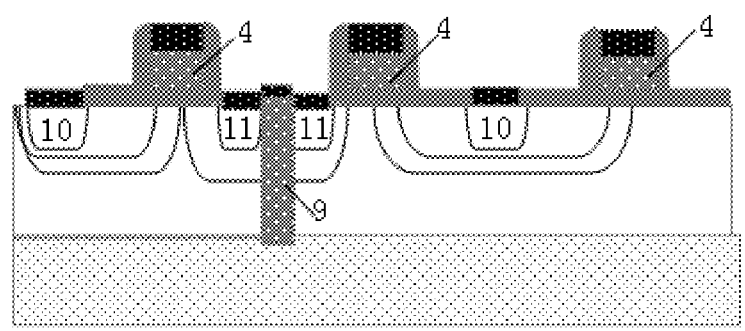
FIG. 17 depicts a cross sectional view illustrating the parallel interconnection of the plurality of gates.

The resulting P-type LDMOS device is a discrete device including an array of a plurality of gates interconnected in parallel. It has a maximum total output current of greater than 10 A and a total gate width of greater than 50 mm. Referring to FIGS. 16 and 17, in the device, an N-type channel 5 is electrically connected to a corresponding polysilicon sinker 9, and the latter electrically connects a corresponding source 11 to the N-type substrate 1. On both sides of each of a heavily doped P-type drain 10 and a polysilicon sinker 9, there is formed a gate. That is, every two adjacent gates co-share a drain 10 and a polysilicon sinker 9.

As indicated above, the method of the present invention uses the polysilicon and metal silicide to form the gate structure and adjusts the sequential order of the channel implantation, long-time high-temperature drive-in, heavily doped N-type polysilicon sinker formation and polysilicon gate boron doping processes to make the gate not be doped with boron during its formation. This allows the high-temperature drive-in process to be carried out for a sufficiently long time to form a channel with a desired length and prevents a short channel effect which may cause penetration or electric leakage of the resulting device. Moreover, carrying out the silicon oxide deposition, polysilicon sinker formation, gate sidewall spacers formation and polysilicon gate doping processes after the lightly doped drain drift region is formed enables the implantation of boron not to be followed by any high-temperature drive-in process, thereby preventing boron from penetrating through the gate oxide layer, and also preventing the N-type impurity in the polysilicon sinker from diffusing out into the channel or other regions. All of these advantages ensure stable operation for the resulting device and simplicity for the method.

The specific embodiments disclosed above are solely for describing the present invention and are not intended to limit the invention in any way. Those skilled in the art can make various modifications and variations without departing from the scope of the invention. Thus, it is intended that the present invention embrace all such modifications and variations.

What is claimed is:

1. A method of fabricating a P-type surface-channel laterally diffused metal oxide semiconductor (LDMOS) device, comprising the following steps in the sequence set forth:

step a) sequentially growing an N-type epitaxial region and a gate oxide layer over an N-type substrate and depositing a non-doped polysilicon layer over the gate oxide layer;

step b) etching the non-doped polysilicon layer to form a polysilicon gate and performing an N-type ion implantation with a portion of the polysilicon gate and a portion of the gate oxide layer, both on a first side of the polysilicon gate, covered with a photoresist, wherein an energy of the N-type ion implantation is controlled to make the implanted ions not penetrate through the polysilicon gate;

step c) removing the photoresist and performing a first P-type ion implantation, followed by a high-temperature drive-in process, thereby forming a first lightly doped drain drift diffusion region in a portion of the N-type epitaxial region on the first side of the polysilicon gate and an N-type channel in a portion of the N-type epitaxial region on a second side of the polysilicon gate, wherein both of the N-type channel and the first lightly doped drain drift diffusion region laterally extend a certain distance under the polysilicon gate;

step d) performing a second P-type ion implantation on the first side of the polysilicon gate, thereby forming a second lightly doped drain drift diffusion region in the first lightly doped drain drift diffusion region;

step e) depositing a silicon oxide layer, removing a portion of the silicon oxide layer covering a portion of the N-type channel at a farther end from the polysilicon gate to expose a corresponding portion of the underlying N-type epitaxial region, and etching the exposed portion of the N-type epitaxial region to form a deep trench, wherein the deep trench has its bottom in the N-type substrate;

step f) depositing a heavily doped N-type polysilicon in the deep trench and on the silicon oxide layer, such that the deep trench is fully filled with the heavily doped N-type polysilicon, thereby forming a polysilicon sinker;

step g) etching back the heavily doped N-type polysilicon until reaching the silicon oxide layer;

step h) depositing an organic dielectric layer and performing an etch back process on the organic dielectric layer and the silicon oxide layer to remove a portion of the organic dielectric layer and the underlying portion of the silicon oxide layer above a top face of the polysilicon gate, such that portions of the silicon oxide layer remained on the first and second sides of the polysilicon gate serve as silicon oxide sidewall spacers and a certain thickness of the organic dielectric layer is remained on an area other than top faces of the polysilicon gate and the silicon oxide sidewall spacers;

step i) performing a third P-type ion implantation on the polysilicon gate with an energy controlled to make the implanted ions not penetrate through the remaining portions of the organic dielectric layer and the silicon oxide layer;

step j) removing the organic dielectric layer and a portion of the silicon oxide layer to expose a portion of each of the N-type channel and the second lightly doped drain drift diffusion region and performing a source/drain ion implantation and a rapid thermal annealing process, thereby forming a source in the N-type channel and a drain in the second lightly doped drain drift diffusion region; and step k) forming a metal silicide layer on a top face of each of the polysilicon gate, the source and the drain.

2. The method according to claim 1, wherein in the step a), the N-type substrate is heavily doped and has a doping concentration of greater than $10^{20}$ cm$^{-3}$, and the N-type epitaxial region is light doped and has a doping concentration of $10^{14}$ cm$^{-3}$ to $10^{16}$ cm$^{-3}$.

3. The method according to claim 1, wherein in the step a), the gate oxide layer has a thickness of 120 Å to 300 Å, and the non-doped polysilicon layer has a thickness of 1500 Å to 4000 Å.

4. The method according to claim 1, wherein in the step b), the N-type ion implantation is a self-aligned channel implantation with phosphorus ions implanted at an energy of lower than 80 keV and a dose of $10^{12}$ cm$^{-2}$ to $10^{14}$ cm$^{-2}$.

5. The method according to claim 1, wherein in the step c), boron ions are implanted in the first P-type ion implantation at an energy of 30 keV to 120 keV and a dose of $10^{11}$ cm$^{-2}$ to $10^{13}$ cm$^{-2}$.

6. The method according to claim 1, wherein in the step c), the high-temperature drive-in process is performed at a temperature of 900° C. to 1050° C. for 30 minutes to 180 minutes.

7. The method according to claim 1, wherein in the step d), boron ions are implanted in the second P-type ion implantation at an energy of 30 keV to 120 keV and a dose of $10^{11}$ cm$^{-2}$ to $10^{13}$ cm$^{-2}$.

8. The method according to claim 1, wherein in the step e), the silicon oxide layer has a thickness of 1500 Å to 3000 Å.

9. The method according to claim 1, wherein in the step f), the heavily doped N-type polysilicon is doped with phosphorus or arsenic ions and has a doping concentration of greater than $10^{20}$ cm$^{-3}$.

10. The method according to claim 1, wherein in the step f), a ratio of a thickness of the heavily doped N-type polysilicon deposited above the silicon oxide layer to a width of the deep trench is greater than 1.2.

11. The method according to claim 1, wherein after the etch back process in the step g), a top face of the remaining portion of the N-type heavily doped polysilicon that makes up the polysilicon sinker is 0 Å to 300 Å higher than a top face of the N-type epitaxial region.

12. The method according to claim 1, wherein in the step h), the organic dielectric layer has a thickness of 1000 Å to 5000 Å.

13. The method according to claim 1, wherein in the step i), boron ions are implanted in the third P-type ion implantation at an energy of 2 keV to 15 keV and a dose of greater than $10^{15}$ cm$^{-2}$.

14. The method according to claim 1, wherein in the step j), boron ions are implanted in the source/drain ion implantation at an energy of 5 keV to 80 keV and a dose of greater than $10^{15}$ cm$^{-2}$.

15. The method according to claim 1, wherein in the step j), the rapid thermal annealing process is performed at a temperature of 1000° C. to 1100° C. for 5 seconds to 30 seconds.

* * * * *